(12) United States Patent
Fishkin et al.

(10) Patent No.: US 6,460,551 B1
(45) Date of Patent: Oct. 8, 2002

(54) MEGASONIC RESONATOR FOR DISK CLEANING AND METHOD FOR USE THEREOF

(75) Inventors: Boris Fishkin, San Carlos; Alexander Lerner, San Jose; Jianshe Tang, Cupertino; Brian J. Brown, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/430,345

(22) Filed: Oct. 29, 1999

(51) Int. Cl.[7] .............................. B08B 3/12; B08B 7/04
(52) U.S. Cl. ........................ 134/147; 134/1; 134/1.3; 134/184; 134/902
(58) Field of Search ............................ 134/184, 186, 134/147, 902, 1.3, 1

(56) References Cited

U.S. PATENT DOCUMENTS

| | | | |
|---|---|---|---|
| 2,987,068 A | | 6/1961 | Branson |
| 4,869,278 A | * | 9/1989 | Bran ........................ 134/184 |
| 5,071,776 A | * | 12/1991 | Matsushita et al. ............ 134/1 |
| 5,090,432 A | * | 2/1992 | Bran ........................ 134/139 |
| 5,148,823 A | * | 9/1992 | Bran ........................ 134/184 |
| 5,247,954 A | * | 9/1993 | Grant et al. ................ 134/184 |
| 5,279,316 A | * | 1/1994 | Miranda .................. 134/102.1 |
| 5,286,657 A | | 2/1994 | Bran |
| 5,365,960 A | * | 11/1994 | Bran ........................ 134/184 |
| 5,379,785 A | * | 1/1995 | Ohmori et al. ............. 134/184 |
| 5,534,076 A | * | 7/1996 | Bran .............................. 134/1 |
| 5,626,159 A | * | 5/1997 | Erk et al. .................... 134/147 |
| 5,672,212 A | * | 9/1997 | Manos ........................ 134/1.3 |
| 5,996,601 A | * | 12/1999 | Kern, Jr. et al. ............. 134/184 |
| 6,026,832 A | * | 2/2000 | Sato et al. ................... 134/184 |
| 6,098,643 A | * | 8/2000 | Miranda ...................... 134/186 |
| 6,119,708 A | * | 9/2000 | Fishkin et al. .............. 134/140 |
| 6,189,552 B1 | * | 2/2001 | Oshimowo .................. 134/201 |
| 6,311,702 B1 | * | 11/2001 | Fishkin ....................... 134/1.3 |

FOREIGN PATENT DOCUMENTS

| | | | |
|---|---|---|---|
| JP | 04196219 | | 7/1992 |
| WO | WO-98/24114 | * | 6/1998 |
| WO | 00/28578 | | 5/2000 |

* cited by examiner

*Primary Examiner*—Alexander Markoff
(74) *Attorney, Agent, or Firm*—Dugan & Dugan

(57) ABSTRACT

A Megasonic cleaning apparatus having at least one reflector (e.g., a parabolic or paraboloid reflector) positioned to collect otherwise wasted cleaning energy and redirect that energy to one or a plurality of positions on a wafer's edge is provided. A first embodiment comprises a complex parabolic reflector which has a width greater than that of the wafer and a preferred length approximately equal to the diameter of the wafer, and which is shaped to provide focal points which vary along the length of the parabolic reflector, such that energy striking the reflector at different points along the reflector's length is directed to a plurality of different points along the wafer's edge. A second embodiment comprises a simple parabolic reflector having a width greater than that of the wafer and a preferred length less than the diameter of the wafer, and which is provided to focus at a cord along the wafer's surface, effectively focusing cleaning energy on two points along the wafer's edge at any given time. Yet another embodiment of the invention comprises a paraboloid reflector having a width greater than that of the wafer and a preferred length which is substantially less than the diameter of the wafer and which is shaped to focus all collected energy to a single point on the wafer's edge. Multiple such reflectors may be positioned in the cleaning tank to optimize energy usage and wafer cleaning.

16 Claims, 4 Drawing Sheets

MEGASONIC RESONATOR FOR DISK CLEANING AND METHOD FOR USE THEREOF

FIELD OF THE INVENTION

The present invention relates generally to apparatuses for cleaning thin discs, such as semiconductor wafers, compact discs, flat panel displays, glass substrates, and the like (i.e., wafers). More particularly, the invention relates to megasonic cleaning of such wafers.

BACKGROUND OF THE INVENTION

For fabrication of semiconductor devices, thin slices or wafers of semiconductor material require polishing by a process that applies an abrasive slurry to the wafer's surfaces. After polishing, slurry residue is generally cleaned or scrubbed from the wafer surfaces via mechanical scrubbing devices. A similar polishing step is performed to planarize dielectric or metal films during subsequent device processing on the semiconductor wafer.

After polishing, be it during wafer or device processing, slurry residue conventionally is cleaned from wafer surfaces by submersing the wafer into a tank of sonically energized cleaning fluid, by spraying with sonically energized cleaning or rinsing fluid, by mechanically cleaning the wafer in a scrubbing device which employs brushes, such as polyvinyl acetate (PVA) brushes, or by a combination of the foregoing.

Although these conventional cleaning devices remove a substantial portion of the slurry residue which adheres to the wafer surfaces, slurry particles nonetheless remain and may produce defects during subsequent processing. Specifically, subsequent processing has been found to redistribute slurry residue from the wafer's edges to the front of the wafer, causing defects.

A number of devices have been developed to improve wafer edge cleaning. Most of the devices are employed during a separate cleaning step following the major surface cleaning. However, a few scrubbing devices have been developed which can simultaneously scrub both the major and the edge surfaces of a wafer. One such device is shown in the side elevational view of FIG. 1. The scrubbing device 11 of FIG. 1 comprises a pair of PVA brushes 13a, 13b. Each brush comprises a plurality of raised nodules 15 across the surface thereof. The scrubber also comprises a platform 19 for supporting a wafer W, a plurality of spinning mechanisms 19a–c for spinning the wafer W, and a mechanism (not shown) for rotating the PVA brushes 13a, 13b. During scrubbing, a fluid supply mechanism F supplies fluid to both major surfaces of the wafer, dislodging particles and cleaning residue from the wafer and brushes 13a, 13b. Preferably, the pair of PVA brushes 13a, 13b are positioned to extend beyond the edge of the wafer W so as to facilitate cleaning the wafer's edges. The illustrated system further employs a separate edge brush 21, which is driven by a separate motor (not shown) that causes the edge brush to rotate. The edge brush fits over the edge of the wafer W providing more effective wafer edge cleaning.

Although the aforementioned mechanical means address the need to clean slurry residue from the wafer's edge, they do so at the expense of increased scrubber complexity and cost, and require frequent edge brush replacement because of excessive mechanical wear. Often, megasonic wafer cleaning within a submersion tank is preferred to scrubber type cleaning, for the foregoing cost considerations and in instances when it is desirable to alter the chemistry of the cleaning solution. The commonly-used materials for scrubbing brushes have limited chemical compatibility and cannot be used with certain Chemistries. In such instances, the need for a conventional edge scrubber following megasonic cleaning significantly increases wafer cleaning time, reduces productivity, and increases the costs of wafer processing. A drawback to megasonic cleaning, however, has been that, while the major surfaces are effectively exposed to the megasonic energy, residue at the beveled wafer edges is not as effectively removed.

Accordingly, it is an object of the present invention to provide an improved method and apparatus for megasonically cleaning wafers.

It is another object of the present invention to provide an improved apparatus for optimizing megasonic cleaning of wafers.

SUMMARY OF THE INVENTION

The foregoing and other objects of the invention are realized by the present invention which comprises a megasonic cleaning apparatus having at least one reflector positioned to collect otherwise wasted cleaning energy and redirect that energy to one or a plurality of points on the wafer's edge.

A first embodiment of the invention comprises a reflector, preferably a paraboloid reflector, which is shaped to focus all collected energy to a single point of the wafer's edge. Energy which has been generated by a transducer and which passes the wafer will be collected by the reflector and redirected to a single point on the wafer's edge. A plurality of such single focal point reflectors may be employed.

Another embodiment of the invention comprises a complex parabolic reflector which is shaped to provide focal points which vary along the length of the parabolic reflector, such that energy striking the reflector at different points along the reflector length will be directed to a plurality of different points along the wafer's edge. The larger the edge surface area along which the parabolic reflector is focused, the longer the edge cleaning duty cycle experienced by the inventive cleaning apparatus. Accordingly a longer reflector is preferred to increase cleaning efficiency and throughput. Most preferably a reflector is configured to provide focal points along half of the wafer's circumference.

Yet another embodiment comprises a simple parabolic reflector which is provided to focus on a cord along the wafer's surface, effectively focusing cleaning energy on two points along the wafer's edge at any given time.

Other objects, features and advantages of the present invention will become more fully apparent from the following detailed description of the preferred embodiments, the appended claims, and the accompanying drawings.

BRIEF DESCRIPTION OF THE DRAWINGS

The invention will now be described in detail with specific reference to the appended drawings wherein.

DETAILED DESCRIPTION OF THE PREFERRED EMBODIMENT

Figure 1:
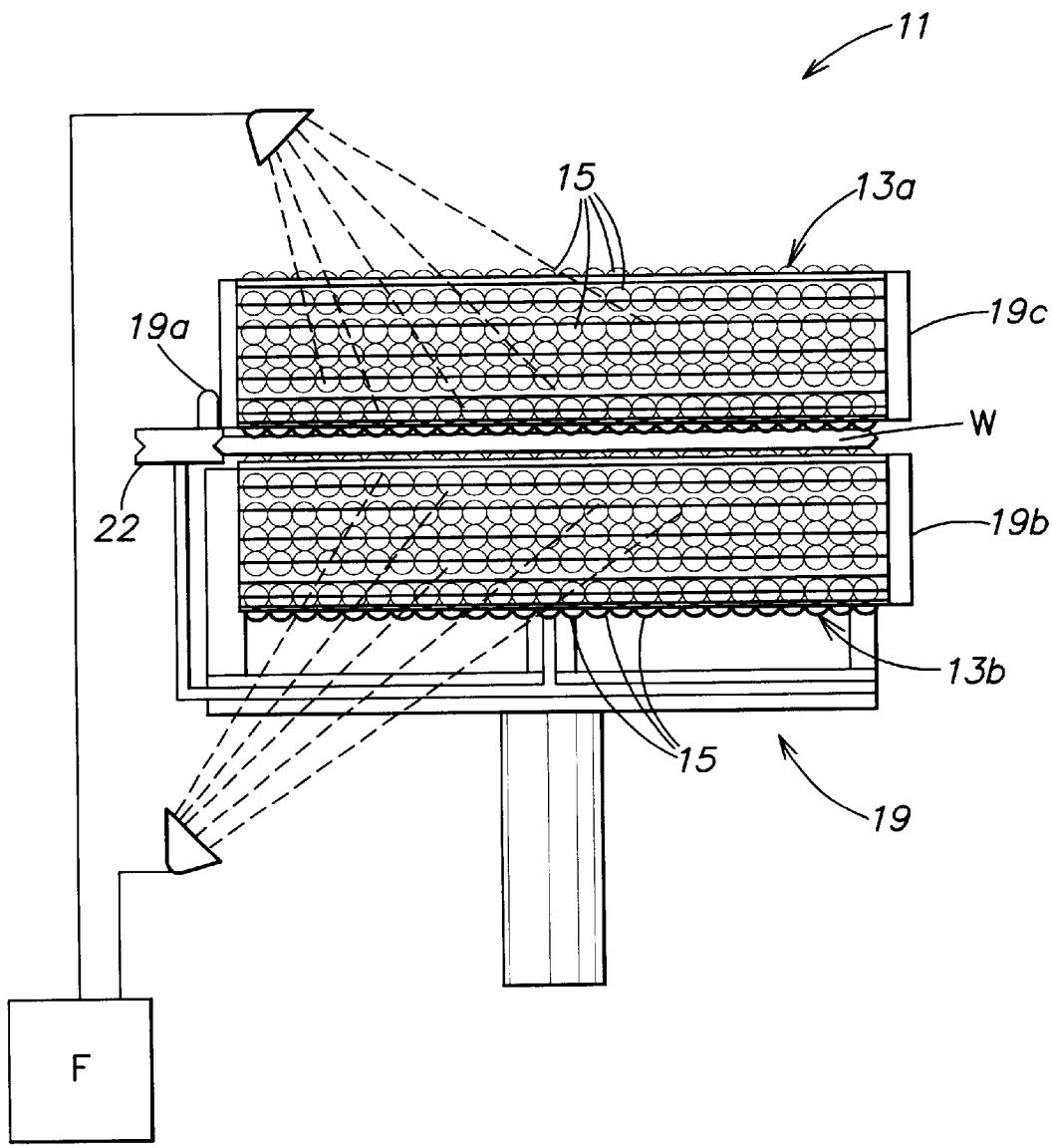
FIG. 1 is a plan view of a prior art scrubbing device for wafer cleaning as previously described.
Figure 2:
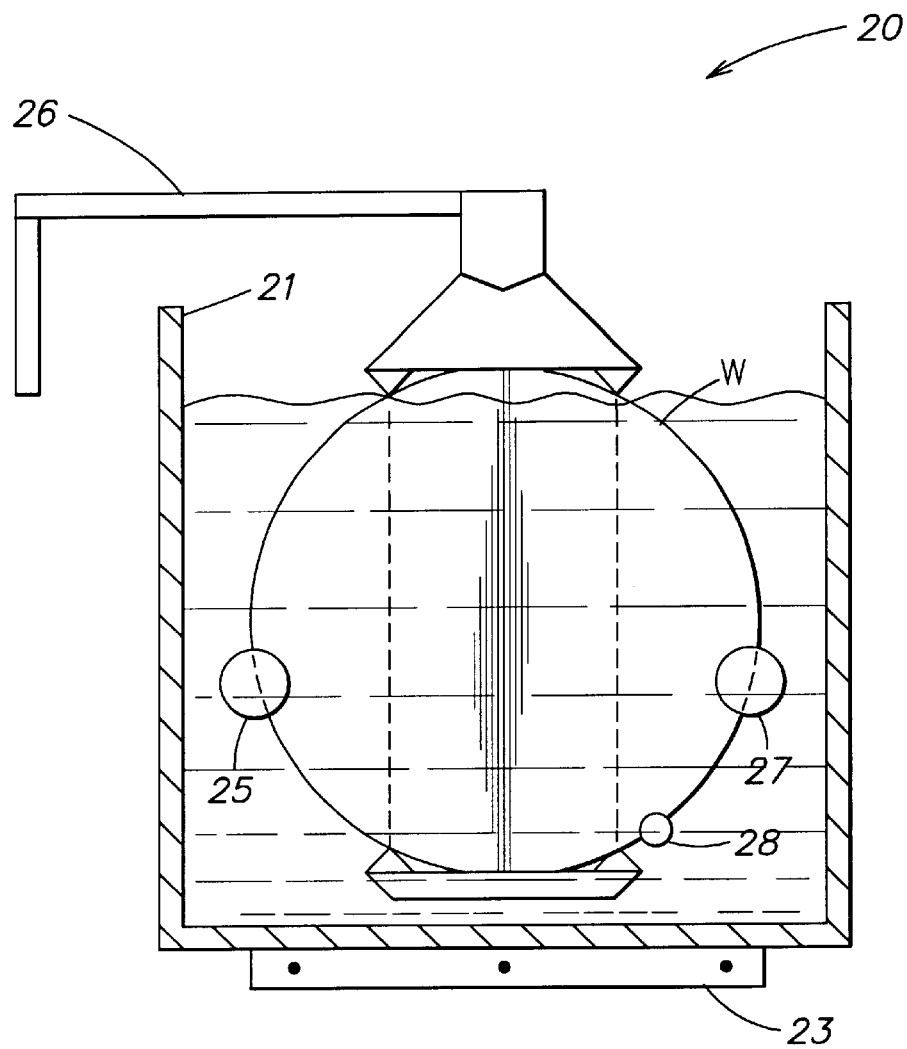
FIG. 2 is a front view of a megasonic wafer cleaning apparatus.

FIG. 2 is a front view of a megasonic cleaning tank for which the inventive apparatus and method have been developed. A megasonic cleaning apparatus, as detailed in U.S. patent application Ser. No. 09/191,057, entitled "Method and Apparatus for Cleaning the Edge of a Thin Disc", having a filing date of Nov. 11, 1998, and assigned to the present assignee, includes a transducer 23, optimally having a length which is substantially equal to the diameter of the wafer, disposed at the bottom of tank 21 of the megasonic cleaning apparatus 20. Above the transducer 23, a first wafer support 25 and a second wafer support 27 are positioned to vertically support the wafer in line with the transducer 23. The wafer supports 25 and 27 are rotatable, and each preferably comprises a rotatable wheel having a v-shaped groove for supporting a wafer with minimal contact. At least one of the wafer supports 25 and 27 is operatively coupled to a motor (not shown) for causing the support to rotate, thereby rotating the wafer. A stabilizing mechanism 28 is additionally included and positioned so as to contact and stabilize the wafer to prevent wobbling. Preferably the stabilizing mechanism 28 is off-set from the wafer's vertical diameter so as not to block the flux of transducer energy from reaching the center of the wafer. To further minimize energy blockage the wafer supports 25 and 27 may be positioned just below the wafer's horizontal diameter.

In operation, a mechanical wafer handler 26 inserts the wafer into the tank 21 and the wafer's edges are engaged by the wafer supports 25 and 27 and the stabilizing mechanism 28. Transducer 23 is energized (e.g., by an oscillating power source, not shown) and begins oscillating at a megasonic rate. Megasonic energy is therefore coupled to the fluid resulting in cavitation in the fluid. The oscillating cavitations, or bubbles in the fluid gently clean the wafer. The acoustic field results in acoustic streaming, which helps to transport removed particles out of the tank 21. The motor (not shown), coupled to at least one of the wafer supports 25 and 27, is energized and rotates the at least one wafer support 25 and/or 27, causing the wafer to rotate. As the wafer rotates, as much as nearly 50 percent of the wafer's edge surface may be contacted by megasonic energy from the transducer 23 at any given time, due to the fact that the length of the transducer is approximately equal to the diameter of the wafer. It has been observed, however, that there is a substantial amount of transducer energy which is wasted as it is directed past the wafer.

Figure 3:
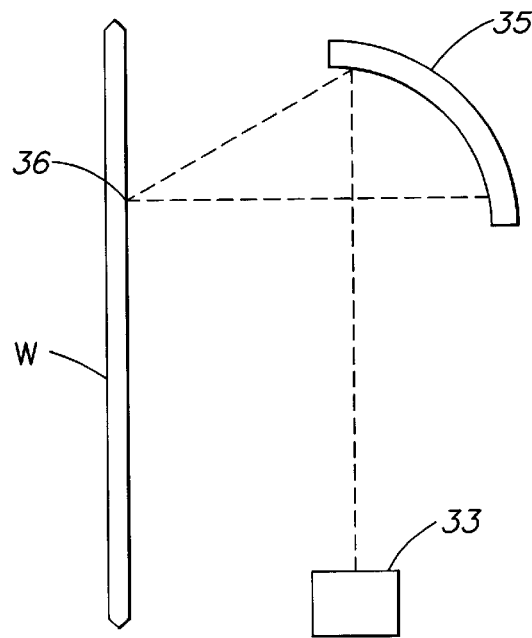
FIG. 3 is a side view of an alternative implementation of a megasonic wafer cleaning apparatus.

FIG. 3 illustrates a side view of an improvement to megasonic cleaning, which is found in U.S. patent application Ser. No. 09/191,060, entitled "Improved Megasonic Cleaner", filed on Nov. 11, 1998, and assigned to the present assignee. In that application, a transducer assembly is employed which comprises a transducer 33 operatively coupled in angular relationship to a focusing element 34. Transducer energy from transducer 33 is focused by focusing element 34 into line 36 which is scanned along the wafer's surface. Preferably to scan the energy across the wafer, the wafer W is rotated and/or oscillated in the vertical direction by a mechanism (not shown) such that point on the wafer surface receives the concentrated energy.

Figure 4:
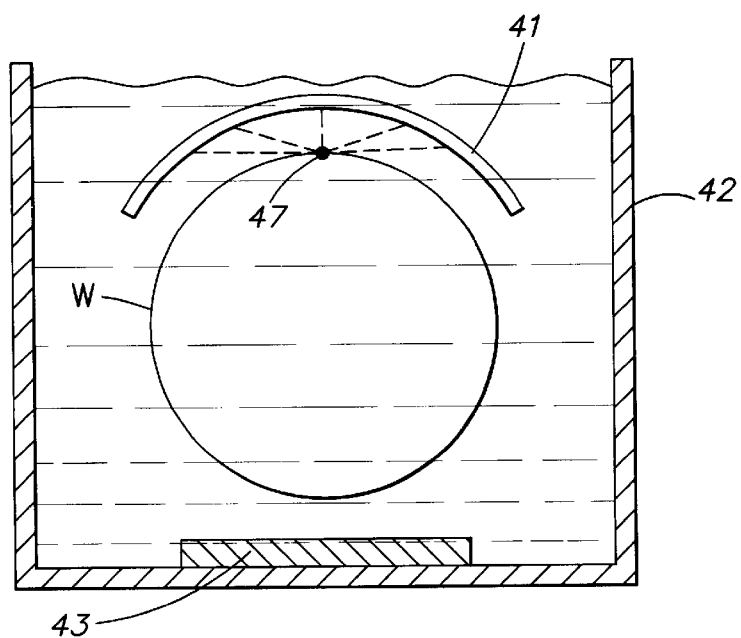
FIG. 4 is a side view of a first embodiment of the inventive megasonic cleaning apparatus.

FIG. 4 is a side view of a first embodiment of the inventive megasonic cleaning apparatus. The embodiment illustrated in FIG. 4 provides a single focal point reflector 41 immersed in the fluid and positioned to concentrate all reflected energy originating at transducer 43 to one point 47 on the surface of wafer W in tank 42. As illustrated, the single focal point reflector 41 is preferably a paraboloid reflector having a width which is greater than that of the wafer and limited only by the dimensions of the tank. The reflector width is optimized to effectively collect whatever transducer-generated energy passes the wafer. The length of a single focal point paraboloid reflector 41 is limited only by the curvature necessary to provide redirection of energy to the same focal point from all positions on the reflector.

In operation, transducer 43 is activated and, consequently, the fluid within tank 42 is energized, with the energy being directed upward toward the wafer W. A percentage of the energy passes the wafer, often with no cleaning benefit. That energy which has passed the wafer will strike reflector 41 and be redirected to a single point 47 on the wafer's edge. In this way, point 47 on the wafer's edge, which receives only a fraction of the transducer-generated direct cleaning energy, will receive concentrated reflected cleaning energy (i.e., cleaning energy which has not passed the wafer). Moreover, as the wafer is rotated by the rotating mechanism (not shown), adjacent points on the wafer's edge may be cleaned simultaneously by a plurality of single point reflectors. For instance, the curvature of reflector 41 provides for optimal concentration of energy at the point 47 on the wafer's edge; however, the width of such a reflector may be less than the diameter of the wafer, thereby allowing other unfocussed energy, which has passed the wafer, to remain uncollected. It may, therefore, be desirable to provide a plurality of single focal point reflectors for focussing at a plurality of single points on the wafer's edge.

Figure 5A:
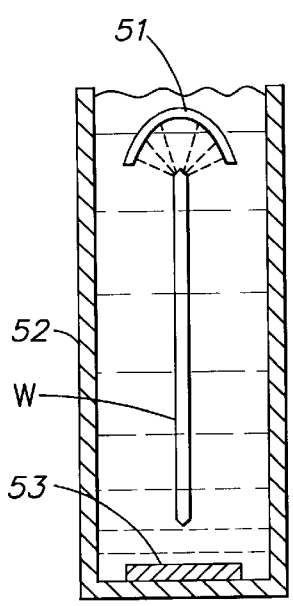
FIG. 5A is a side view of a second embodiment of the inventive megasonic cleaning apparatus.

FIG. 5A is a side view of an alternative embodiment of the inventive megasonic cleaning apparatus wherein a parabolic reflector 51 is positioned above the wafer W, and is submerged in fluid disposed in tank 52. The parabolic reflector 51 has a width which is greater than that of the wafer, and is limited only by the width of the tank 52. The reflector width is, as above, optimized to effectively collect energy produced by transducer 53, which otherwise would have been wasted or may reflect from the fluid surface in a random manner and interfere with the direct cleaning energy emitted by the transducer 53. The length of the parabolic reflector 51 is preferably approximately equal to the diameter of the wafer W to maximize the number of points along the perimeter of the wafer that will receive the redirected energy at any given time.

Figure 5B:
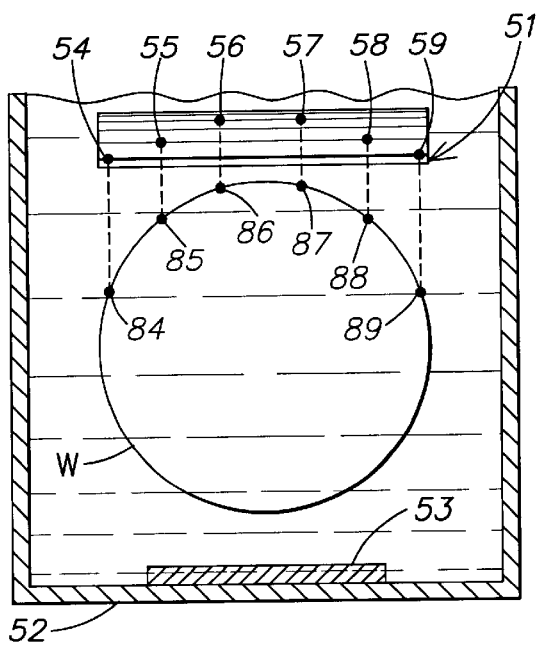
FIG. 5B is a side view of the second embodiment of the invention illustrated in FIG. 5A.

The front view of FIG. 5B illustrates that the shape of the complex parabolic reflector 51 is customized, whereby the focal point is varied along the length of the reflector 51 so that reflected energy is focussed on a plurality of points along the wafer's edge. Accordingly, the curvature of the parabola 51 at each of locations 54–59 differs to provide different focal points for energy which strikes the reflector at each of those different locations. While, for the sake of illustration, six (6) different reflector locations are shown as directing reflected energy to six different points on a wafer, it will be understood by one having skill in the art that any number of locations having different focal points may be fabricated on a complex parabolic reflector and thus, the focal points may be adjusted in a continuum so as to simultaneously focus energy to each point along a portion of the wafer's edge. In the illustrated apparatus, transducer 53 is positioned at the bottom of tank 52. The length of the transducer 53 is preferably at least the same as the diameter of the wafer, to ensure that all wafer surfaces can be exposed to the sonic energy.

In operation, transducer 53 is activated and the fluid within tank 52 is energized, with the energy being directed upward toward the wafer W. A percentage of the energy passes the wafer, often with no cleaning benefit. That energy which has passed the wafer will strike reflector 51 and be redirected to points on the wafer's edge. Specifically, energy striking the reflector at location 54, will be redirected to point 84 on the wafer's edge. Similarly, energy arriving at locations 55–59 will be focussed respectively at points 85–89, along the wafer's edge. In this way, a plurality of points 54–59 on the wafer's edge, which would otherwise have received only a fraction of the direct transducer-generated cleaning energy, receive concentrated reflected cleaning energy. Moreover, as the wafer is rotated by the rotating mechanism (not shown), the entire perimeter of the wafer's edge will be cleaned.

Figure 6A:
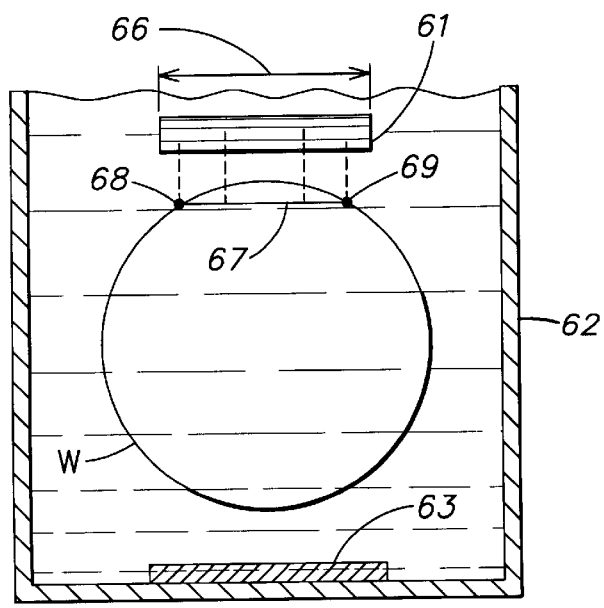
FIG. 6A is a front view of a third embodiment of the inventive megasonic cleaning apparatus.
Figure 6B:
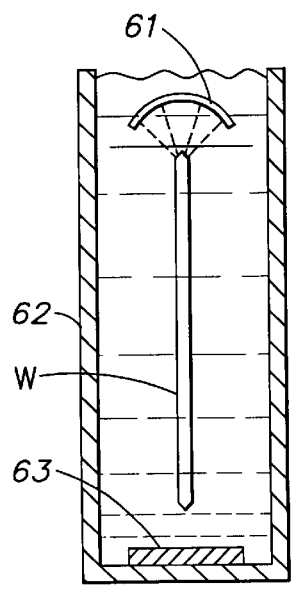
FIG. 6B is a side view of the third embodiment of the invention illustrated in FIG. 6A.

FIG. 6A provides a side view illustration of an alternative embodiment of the present invention comprising a simple and inexpensive parabola 61. Parabolic reflector 61 is a simple reflector having a fixed curvature which results in a constant focal length along the length 66 of the reflector. The parabolic reflector 61 is positioned above the wafer W which is submerged in fluid disposed within tank 62. The wafer is rotated within tank 62 to be cleaned by the fluid energized by transducer 63. As depicted in the side view of FIG. 6B, energy from transducer 63 which passes the wafer W will contact the parabolic reflector 61 at various locations along its length 66. Due to the fact that the reflector 61's curvature is fixed, energy striking the reflector 61 at any location along its length 66 will be focussed in a cord, or line 67, a fixed distance from the reflector. Points 68 and 69 along the wafer's edge will be cleaned by the focussed energy, as will all points on the wafer's surface which are located along the cord 67.

The foregoing description discloses only the preferred embodiments of the invention, modifications of the above-disclosed apparatus and method which fall within the scope of the invention will be readily apparent to those having ordinary skill in the art. For instance, a plurality of reflectors, preferably parabolic or paraboloid reflectors, may be employed for collecting energy generated by one or a plurality of transducers. Furthermore, the location of the parabolic or paraboloid reflectors may be modified to optimize collection and redirection of wasted energy to the wafer's edges, depending on the preferred location and orientation of the transducer(s). Redirection of energy which has been reflected at the tank surfaces (sidewalls, etc.) or at the fluid surface, in addition to the redirection of passing energy by strategically positioned reflectors, can further optimize the energy efficiency of megasonic cleaning. A combination of reflectors for directing sonic energy to a wafer, for redirecting passing sonic energy and for redirecting reflected sonic energy is additionally contemplated. The reflectors may be positioned vertically beside the wafer's edge, rather than above the wafer's edge in which case they might receive cleaning energy form a transducer positioned along the opposite side wall of the tank. In such an embodiment the wafer would not need to be completely submerged. The reflectors may be used in embodiments such as those described with reference to FIG. 3, in which case the reflector is positioned along the backside of the wafer to receive cleaning energy which travels through the major surface of the wafer and to direct the cleaning energy to the wafer's edge. In sum, the inventively employed reflectors can be advantageously used within virtually any megasonic tank type cleaner. Therefore, it will be understood by those of ordinary skill in the art, that the embodiments provided herein are merely exemplary of the presently preferred embodiments of the invention, and the invention is not to be limited thereby. Similarly, it will be understood that cleaning energy may contact the wafer preferably assisting in cleaning thereof, and then continue past the wafer. Thus the term passing sonic energy refers to energy which passes the wafer and in doing so may or may not contact the wafer. Finally, it will be understood that a single focal point may include an area of adjacent points, and that any reflector which focuses rays to a focal point may be employed, although a reflector which focuses parallel rays to a focal point (e.g., a parabolic or paraboloid reflector) is preferred.

Accordingly, while the present invention has been disclosed in connection with the preferred embodiments thereof, it should be understood that other embodiments may fall within the spirit and scope of the invention, as defined by the following claims.

The invention claimed is:

1. An assembly for improved edge cleaning of a wafer comprising:
    a tank containing fluid, and having:
        a transducer adapted to output sonic energy toward the wafer so as to clean the wafer, wherein at least a portion of the sonic energy passes the wafer; and
        a focusing component positioned based on the focal length of the focusing component so as to direct focused sonic energy to a predetermined portion of the substrate, and such that the wafer is between the focusing component and the transducer so as to receive the sonic energy which passes the wafer, and to focus the passing sonic energy to at least one point on the wafer's edge.

2. An assembly for improved edge cleaning of a wafer comprising:
    a tank containing fluid, and having:
        a transducer adapted to output sonic energy toward the wafer so as to clean the wafer, wherein at least a portion of the sonic energy passes the wafer; and
        a focusing component positioned such that the wafer is between the focusing component and the transducer so as to receive the sonic energy which passes the wafer, and to focus the passing sonic energy;
        wherein the focusing component comprises a parabolic reflector having a plurality of focal points adapted to focus the passing sonic energy to a plurality of locations on the edge of the wafer so as to contact only the edge of the wafer with the focused passing sonic energy.

3. The apparatus of claim 2 wherein the length of the parabolic reflector is approximately equal to the diameter of the wafer.

4. An assembly for improved edge cleaning of a wafer comprising:
    a tank containing fluid, and having:
        a transducer adapted to output sonic energy toward the wafer so as to clean the wafer, wherein at least a portion of the sonic energy passes the wafer; and
        a focusing component positioned such that the wafer is between the focusing component and the transducer so as to receive the sonic energy which passes the wafer, and to focus the passing sonic energy;
        wherein the focusing component comprises a parabolic reflector having a constant focal length adapted to focus passing sonic energy so as to form a straight line of focused energy on the wafer.

5. The apparatus of claim 1 wherein the focusing component comprises at least one reflector adapted to focus sonic energy only to a single focal point on the wafer's edge so as to contact only the edge of the wafer with focused sonic energy.

6. The apparatus of claim 5 wherein the focusing component comprises a plurality of reflectors each adapted to focus sonic energy only to a single focal point on the wafer's edge so as to contact only the edge of the wafer with focused sonic energy.

7. An apparatus for cleaning the edge of a wafer comprising:
- a fluid container adapted to at least partially submerge a wafer;
- a sonic energy source operatively coupled to the container so as to direct sonic energy through a fluid contained within the container to a wafer disposed therein;
- a wafer support configured to support a wafer at least partially submerged in a fluid contained within the container and to support the wafer in line with the sonic energy source;
- a motor operatively coupled to the wafer support and adapted to rotate the wafer supported by the wafer support; and
- at least one focusing component positioned based on the focal length of the focusing component so as to direct focused sonic energy to a predetermined portion of the substrate, and such that the wafer is between the focusing component and the transducer so as to focus sonic energy which has passed the wafer to at least one point on the edge of the wafer.

8. An apparatus for cleaning the edge of a wafer comprising:
- a fluid container adapted to at least partially submerge a wafer;
- a sonic energy source operatively coupled to the container so as to direct sonic energy through a fluid contained within the container to a wafer disposed therein;
- a wafer support configured to support a wafer at least partially submerged in a fluid contained within the container and to support the wafer in line with the sonic energy source;
- a motor operatively coupled to the wafer support and adapted to rotate the wafer supported by the wafer support; and
- at least one focusing component positioned to focus sonic energy which has passed the wafer;
- wherein the focusing component comprises a parabolic reflector having a plurality of focal points adapted to focus sonic energy which has passed the wafer, to a plurality of locations on the edge of the wafer, so as to contact only the edge of the wafer with focused sonic energy.

9. The apparatus of claim 8 wherein the length of the parabolic reflector is approximately equal to the diameter of the wafer.

10. An apparatus for cleaning the edge of a wafer comprising:
- a fluid container adapted to at least partially submerge a wafer;
- a sonic energy source operatively coupled to the container so as to direct sonic energy through a fluid contained within the container to a wafer disposed therein;
- a wafer support configured to support a water at least partially submerged in a fluid contained within the container and to support the wafer in line with the sonic energy source;
- a motor operatively coupled to the water support and adapted to rotate the wafer supported by the wafer support; and
- at least one focusing component positioned such that the wafer is between the focusing component and the transducer so as to receive the sonic energy which passes the wafer, and to focus the passing sonic energy;
- wherein the focusing component comprises a parabolic reflector having a constant focal length relative to sonic energy emitted from the sonic energy source, adapted to focus sonic energy so as to form a straight line of focused energy on the wafer.

11. The apparatus of claim 7 wherein the focusing component comprises at least one reflector adapted to focus sonic energy emitted from the sonic energy source so as to form a single focal point on the wafer.

12. The apparatus of claim 11 wherein the focusing component comprises a plurality of reflectors each adapted to focus sonic energy emitted from the sonic energy source to a single focal point on the wafer.

13. The apparatus of claim 5 wherein the focusing component comprises a paraboloid.

14. The apparatus of claim 6 wherein the focusing component comprises a paraboloid.

15. The apparatus of claim 11 wherein the focusing component comprises a paraboloid.

16. The apparatus of claim 12 wherein the focusing component comprises a paraboloid.

* * * * *